United States Patent [19]
Nakasuji

[11] Patent Number: 5,986,765
[45] Date of Patent: Nov. 16, 1999

[54] APPARATUS INCLUDING COMPENSATION MASK TO CORRECT PARTICLE BEAM PROXIMITY-EFFECT

[75] Inventor: Mamoru Nakasuji, Yokohama, Japan

[73] Assignee: Nikon Corporation, Tokyo, Japan

[21] Appl. No.: 09/218,003

[22] Filed: Dec. 22, 1998

Related U.S. Application Data

[62] Division of application No. 08/774,902, Dec. 27, 1996, Pat. No. 5,888,682.

[30]      Foreign Application Priority Data

Dec. 27, 1995  [JP]  Japan .................................. 7-340880

[51] Int. Cl.$^6$ .................................................. G01B 11/00
[52] U.S. Cl. ............................... 356/399; 355/53; 355/72
[58] Field of Search .................................. 430/5, 22, 30; 355/53, 72; 356/399

[56]      References Cited

U.S. PATENT DOCUMENTS 5,254,438  10/1993  Owen et al. ............................. 430/296
5,316,879  5/1994  Berger et al. ............................ 430/296

FOREIGN PATENT DOCUMENTS 5-175110  7/1993  Japan .

*Primary Examiner*—Christopher G. Young
*Attorney, Agent, or Firm*—Klarquist Sparkman Campbell Leigh & Whinston, LLP

[57]            ABSTRACT

Methods and apparatus for accurately performing proximity-effect compensation exposure are disclosed, even in cases where negative-type particle-beam-sensitive resist material is used. On a compensation mask, regions corresponding to regions on an underlying wafer that are to receive die patterns are subdivided into a multiple subfields having a pitch smaller than the spread width of particles back-scattered from the wafer 7. Certain of the subfields on the compensation mask define an aperture allowing passage therethrough of a particle beam. The aperture sizes are not uniform. Rather, each aperture is equal in area to an area of the nominally unexposed regions of the subfield less a prescribed constant area. The particle beam, after passing through a beam-shaping aperture, irradiates the compensation mask via an objective lens, and is scanned across the compensation mask by deflectors.

10 Claims, 4 Drawing Sheets

APPARATUS INCLUDING COMPENSATION MASK TO CORRECT PARTICLE BEAM PROXIMITY-EFFECT

This application is a divisional of Ser. No. 08/774,902, filed Dec. 27, 1996, now U.S. Pat. No. 5,888,682.

FIELD OF THE INVENTION

The invention pertains to particle-beam lithography methods and apparatus, especially such methods and apparatus employing electron beams. More specifically, the invention pertains to methods and apparatus for reducing a so-called "proximity effect" arising from the scattering of particles from the beam in a particle-beam-sensitive substrate exposed to the charged particle beam.

BACKGROUND OF THE INVENTION

In particle-beam lithography apparatus and methods, a desired pattern is written or projection-exposed on a substrate such as a semiconductor wafer coated with a particle-beam-sensitive resist (hereinafter referred to simply as a "wafer"). Examples of particle beams include protons, ions, and electrons.

The most common particle beam used for such purposes is an electron beam. The electron beam is made incident on the resist in a controlled way. Whenever electrons enter the resist, they lose energy and experience trajectory changes via elastic and inelastic collisions known collectively as "electron scattering." Because scattered electrons can still cause exposure-related changes in the resist, electron scattering can reduce the resolution of pattern linewidths or other desired features to be defined by the electron beam on the wafer. This effect is known in the art as "proximity effect." The main type of scattering responsible for the proximity effect is back-scattering of electrons from the electron beam incident upon the electron-beam-sensitive substrate.

To compensate for the proximity effect, it is known in the art to make substantially equal, over the entire surface of the electron-beam-sensitive substrate, the exposure of the substrate caused by these back-scattered electrons.

To such end, it is known in the art to employ a "compensation mask" particularly with-projection exposure of a particle-beam-sensitive substrate using a particle beam. In such a scheme, the pattern to be transferred (as defined on a mask or "reticle") to the substrate is divided into many subfields. The compensation mask, which is separate from the reticle, is also divided into subfields (preferably in register with the subfields on the wafer). At each subfield on the compensation mask, an aperture through the thickness dimension of the mask is defined having an area that is equal to the area of the nominally unexposed regions of the corresponding subfield region on the substrate. With this method, by keeping the compensation mask and the substrate separated a prescribed distance from each other, uniform compensation exposure of each of the subfields is performed by blurring the energy beam (ultraviolet ray, electron beam, etc.) at the substrate by passage of the beam through the corresponding apertures in the compensation mask.

In the prior art described above, it is possible to favorably compensate for proximity effect whenever a positive resist is used. However, whenever a negative resist is used, it is not possible to achieve high precision of the pattern transferred to the wafer, despite attempts to compensate for proximity effects. More specifically, with a positive resist, if the compensating energy strikes a nominally unexposed region, there is only a small reduction in the resist-film thickness at that region, with no adverse effect on pattern precision. In contrast, with a negative resist, if the compensating energy strikes a nominally unexposed region, some residual resist—a negative resist defect—can remain after developing the resist, making high-precision pattern formation impossible.

Furthermore, with conventional proximity effect compensation methods, there is no particular mechanism for aligning the compensation mask and the substrate. Such alignment has been performed, for example, with a microscope or the like by viewing an open pattern at a prescribed area on the mask and the corresponding pattern on the substrate. But, as the degree of integration of transferred patterns has increased, it has become desirable to increase the precision of alignment of the compensation mask and the substrate, and perform compensation for the proximity effect in minute and close fashion in correspondence with the degree of refinement in the pattern at the various areas on the substrate.

Compensation exposure of the entire surface of the particle-beam-sensitive substrate has conventionally been conducted, for example, by scanning an energy beam of prescribed width across the compensation mask. Unfortunately, the precision by which such scans are placed adjacent each other is typically poor, causing problematic unevenness in compensation exposure at boundary regions between scans.

SUMMARY OF THE INVENTION

In light of the foregoing, a key object of the invention is to provide a proximity-effect compensation method that will permit accurate compensation for the proximity effect to be performed even when a negative-type particle-beam-sensitive material is used.

Another object of the invention is to provide a proximity-effect compensation method that will permit compensation of the proximity effect to be performed with accurate alignment between the compensation mask and the specimen (particle-beam-sensitive substrate) on which compensation is being performed.

Yet another object of the invention is to provide a proximity-effect compensation method that will permit accurate compensation for the proximity effect to be achieved, even when compensation exposure is performed by scanning with an energy beam and the precision of energy beam-seams at the boundary regions of scanned regions deteriorates.

According to a first aspect of the invention, an improved proximity-effect compensation method is provided wherein an energy beam (e.g., electron beam, ion beam, or beam of ultraviolet light) is directed toward a specimen (e.g., wafer) having a particle-beam-sensitive resist coating. A compensation mask is placed between the specimen and the energy-beam source. The compensation mask comprises multiple subfields each of which is smaller in width than the spread-width of energy backscatter in the specimen. At least some of the subfields each define a respective aperture through which the energy beam must pass in order to reach the corresponding subfield on the particle-beam-sensitive resist.

Preferably, each of the apertures has a transverse profile defining an area corresponding, for the respective subfield on the resist, to an area of nominally unexposed regions less a constant. The constant is preferably equal to the area of nominally unexposed regions in a subfield on the resist having the most densely packed features. Such regions tend to have the narrowest line widths (narrowest critical dimensions). Thus, there is substantially no compensation exposure in subfields having the highest feature density. Consequently, even when a negative-type particle-beam-sensitive material is used, there is practically no evidence of a so-called "scumming" phenomenon at nominally unexposed regions. This permits high-resolution formation of high-density patterns. In other subfields having less feature density, compensation exposure occurs because the corresponding subfields on the compensation mask are provided with apertures.

The energy beam irradiated on the specimen preferably exhibits a blurring that is no wider on the specimen than the width of the subfields on the compensation mask. This facilitates a uniform compensation exposure of the subfields on the specimen.

According to another aspect of the invention, the compensation mask preferably comprises alignment marks that can be aligned with corresponding alignment marks on the specimen so as to achieve registration of the compensation mask with the specimen. Further preferably, each set consisting of an alignment mark on the compensation mask and a corresponding alignment mark on the specimen is observed using an optical lens operable to conjugate the compensation mask and the specimen. The optical lenses are preferably mounted on a stage operable to support the compensation mask and the specimen during compensation irradiation.

If, before initiating compensation irradiation, any misalignment is detected between the alignment marks on the compensation mask and the specimen, an appropriate movement of the compensation mask relative to the stage (translational and/or rotational) is made to achieve alignment and thus registration of the compensation mask and the specimen.

According to yet another aspect of the invention, the subfields on the compensation mask are preferably smaller in width than the back-scatter spread width on the particle-beam-sensitive resist. The width of the energy beam in a prescribed direction (e.g., the Y direction) incident on the compensation mask is preferably an integral multiple of the width, in the same direction, of a die pattern on the specimen. The energy beam is preferably swept at a constant velocity in a direction orthogonal to the prescribed direction (e.g., swept in the X direction) on the compensation mask.

According to another aspect of the invention, an apparatus is provided for performing backscatter-compensation exposure of a specimen. The apparatus preferably comprises a source operable to produce an energy beam to which a particle-beam-sensitive resist, on the specimen, is sensitive; a specimen stage, and a compensation mask. The specimen stage is operable to support the specimen during backscatter-compensation exposure. The compensation mask comprises multiple subfields corresponding to subfields on the specimen. At least some of the subfields on the compensation mask each define a respective aperture such that the energy beam from the source must pass through an aperture to reach a corresponding subfield on the specimen. Each subfield on the compensation mask is preferably smaller in width than the spread-width of energy backscatter in the specimen. Finally, each of the apertures on the compensation mask preferably defines an area corresponding, for the respective subfield on the specimen, to an area of nominally unexposed regions less a constant.

The foregoing and additional features and advantages of the present invention will be more readily apparent from the following detailed description, which proceeds with reference to the accompanying drawings.

DETAILED DESCRIPTION

Figure 1:
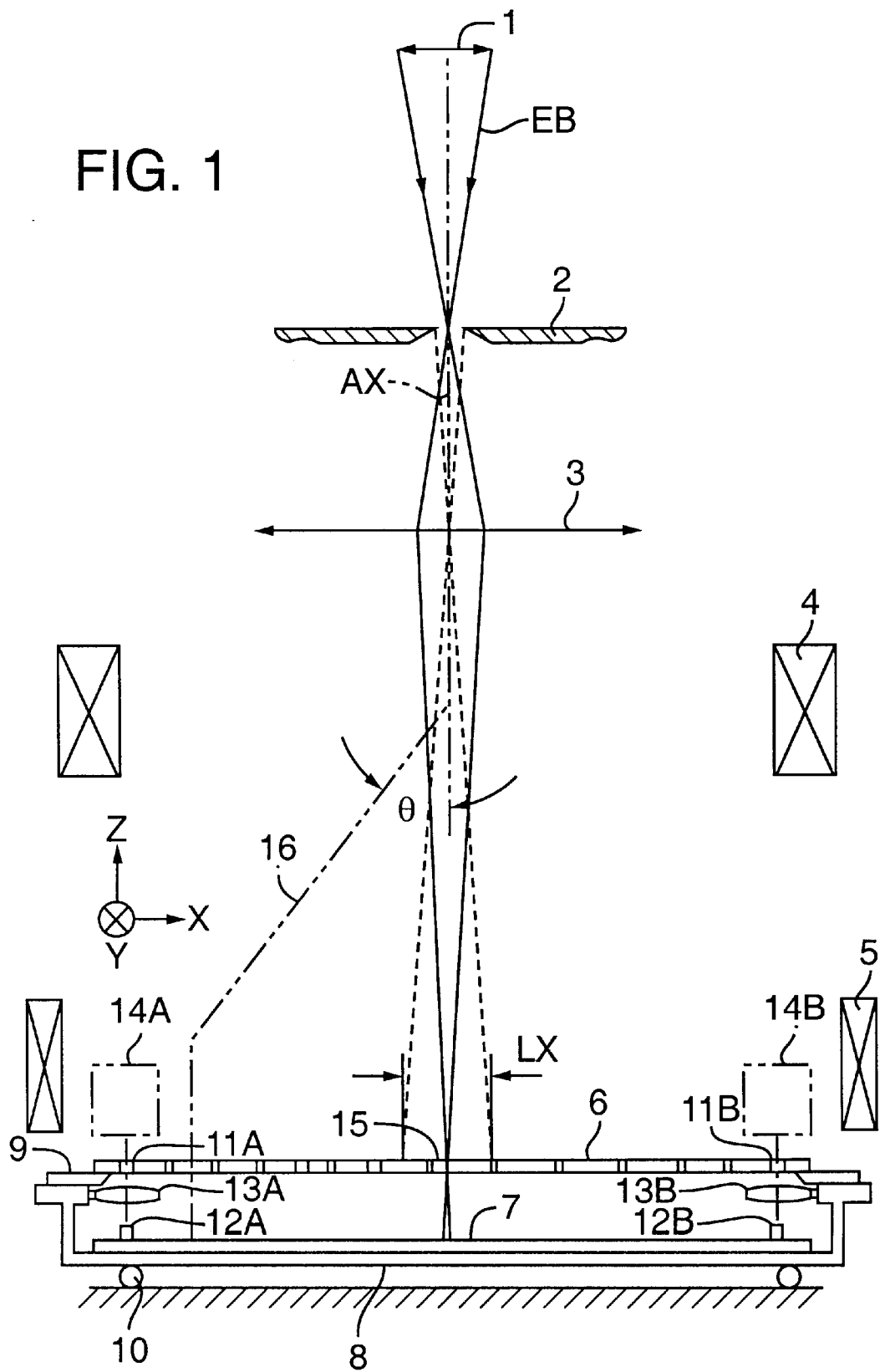
FIG. 1 is a schematic optical diagram showing relevant features of a proximity-effect compensation apparatus according to a preferred example embodiment of the invention.

FIG. 1 shows a preferred embodiment of a proximity-effect compensation apparatus, according to the invention, especially configured for use with an electron beam. The FIG. 1 embodiment represents the current best mode of an apparatus and method according to the invention.

In FIG. 1, during compensation exposure, a "cross-over" (i.e., image of the electron-beam source) 1 is formed by an electron beam emitted from an electron gun (not shown). The electron beam EB from the crossover 1 passes through a beam-shaping aperture 2 that defines the transverse profile of the electron beam. Below the beam-shaping aperture 2 there are arranged in sequence an objective lens 3 comprising an electromagnetic lens, a main deflector 4, a sub-deflector 5, and a compensation mask 6. A wafer 7, serving as the specimen upon which proximity-effect compensation will be performed and that is coated with an electron-beam resist, is situated at a prescribed axial distance from the compensation mask 6. The electron-beam resist is normally a negative resist.

In FIG. 1, for purposes of description, the Z axis is parallel to an optical axis AX of the objective lens 3, the X axis is parallel to the plane of the page, and the Y axis perpendicular to the plane of the page. Thus, the X and Y axes define a plane perpendicular to the Z axis.

Figure 2:
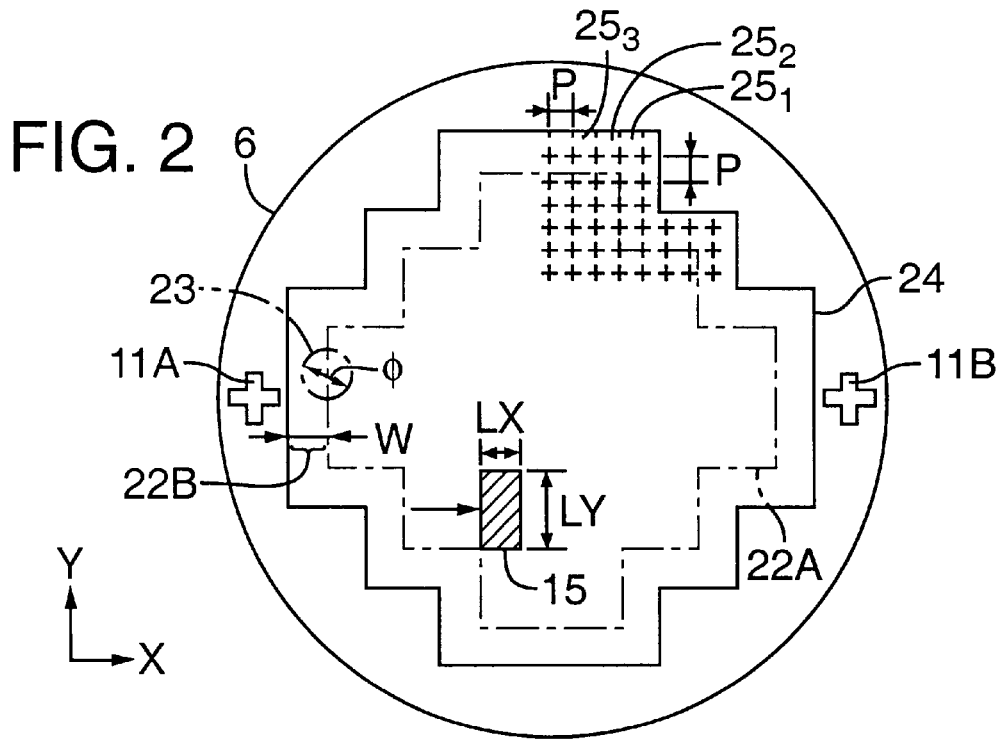
FIG. 2 is a schematic plan view showing certain features of a compensation mask as used in the FIG. 1 embodiment.

During compensation exposure, the electron beam EB, having passed through the beam-shaping aperture 2, is incident on a radiation region 15 of the compensation mask 6 via an objective lens 3. (The radiation region 15 on the compensation mask 6 usually corresponds with a respective die (not shown) on the wafer 7.) The beam-shaping aperture 2 and the compensation mask 6 are arranged in conjugate relationship with respect to the objective lens 3. Not intending to be limiting, FIG. 2 shows that the beam-shaping aperture 2 imparts a rectangular transverse profile to the electron beam EB and thus to the radiation region 15. (The rectangular profile of the radiation region 15 has a width LX in the X direction and length LY in the Y direction.) However, the radiation region 15 can have another profile, such as a square. Usually, the profile of the radiation region 15 is determined by the profile of the respective dies on the wafer.

The electron beam EB is deflected in a first direction from the optical axis AX by the main deflector 4, and in a second direction, opposite from the first direction, by the sub-deflector 5. As a result, the electron beam EB is perpendicularly incident upon the surface of the wafer 7 during compensation exposure. The main deflector 4 and the sub-deflector 5 are operable to sweep the electron beam EB across the compensation mask 6 in the X and Y dimensions. (In FIG. 1, the electron beam EB is swept across the compensation mask 6 in the X dimension radiation-region by radiation-region; after a row of radiation regions in the X dimension are scanned, the electron beam is moved a distance LY in the Y dimension to scan a new row of radiation regions in the X dimension.) As stated above, the electron beam EB is swept in the X dimension preferably at a constant velocity.

The principal ray of the electron beam EB is deflected in the X direction along a trajectory 16 (represented by a dashed line in FIG. 1). If the angle of the trajectory 16 relative to the optical axis AX at a time t is θ, then the current IA(t) at the main deflector 4 and the current IB(t) at the sub-deflector 5 at time t are respectively defined in terms of a prescribed coefficient $I_o$ as follows (where t is the time required for the electron beam EB to be scanned from a location on the optical axis AX to a location corresponding to the maximum deflection angle):

$$IA(t) = I_o(\theta/\tan\theta)t \quad (1)$$

$$IB(t) = -I_o(\theta/\tan\theta)t \quad (2)$$

The wafer 7 is mounted on a movable wafer stage 8, which is supported and moved by a stage drive 10. The compensation mask 6 is also mounted on the wafer stage 8 via a compensation-mask stage 9. The compensation-mask stage 9 is operable to allow positional adjustment of the compensation mask 6, relative to the wafer stage 8, in the X and Y dimensions as well as rotationally about the optical axis AX. The wafer stage 8 is operable to move the wafer 7 independently of the objective lens 3 and deflectors 4, 5.

As is known in the art of electron-beam projection lithography, a reticle defines a die pattern to be transferred to the surface of the wafer 7. On the reticle, the pattern is divided into multiple subfields that are individually projected via the electron beam onto the surface of the wafer in an ordered manner to form each corresponding die pattern on the wafer surface. Each subfield on the reticle represents a portion of a pattern to be transferred from the reticle to the wafer 7, the pattern being defined by regions that block or scatter electrons in the beam and other regions that pass the particles substantially without blocking or scattering them. Different regions of the pattern on the reticle need not have the same pitch.

The compensation mask 6 has multiple subfields each preferably corresponding to a respective subfield on the reticle and a respective subfield on the wafer 7. Each of certain subfields (but not necessarily all subfields) on the compensation mask 6 defines an aperture therethrough. The compensation mask 6 is situated a sufficiently short axial distance from the wafer 7 such that the electron beam EB does not diverge, after passing through an aperture on the compensation mask 6, more than the width of the corresponding subfield on the wafer.

Figure 4:
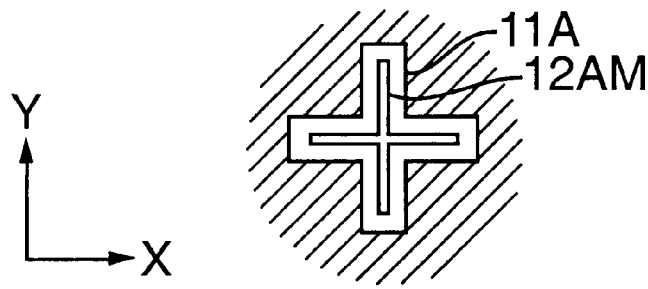
FIG. 4 is an enlarged schematic plan view showing an alignment mark on the compensation mask in register with a corresponding alignment mark on the wafer.

The compensation mask 6 also comprises alignment marks (registration marks) 11A and 11B. Each alignment mark 11A, 11B is preferably a cross-shaped open pattern (FIG. 4) and is situated outside any of the subfields on the compensation mask 6. The alignment marks 11A, 11B are optically detectable. Corresponding cross-shaped alignment marks 12A and 12B, respectively, are situated on the wafer 7. The alignment marks 12A and 12B are sized so as to respectively fit within the alignment marks 11A and 11B (FIG. 4).

Optical lenses 13A and 13B are provided for conjugation of the surfaces of the compensation mask 6 and the wafer 7. The lenses 13A, 13B are respectively arranged between the alignment marks 11A, 11B on the compensation mask 6 and the alignment marks 12A, 12B on the wafer 7. The lenses 13A, 13B are respectively secured to the side walls of the movable stage 8.

As can be understood from the above, production of the desired pattern on the wafer is normally performed by a "pattern-transfer" exposure that is separate from the "compensating" exposure intended to compensate for proximity effects. The compensating exposure can be performed before or after the pattern-transfer exposure. In any event, the pattern-transfer exposure and the compensating exposure should not exceed a prescribed cumulative exposure level for the resist.

Figure 3:
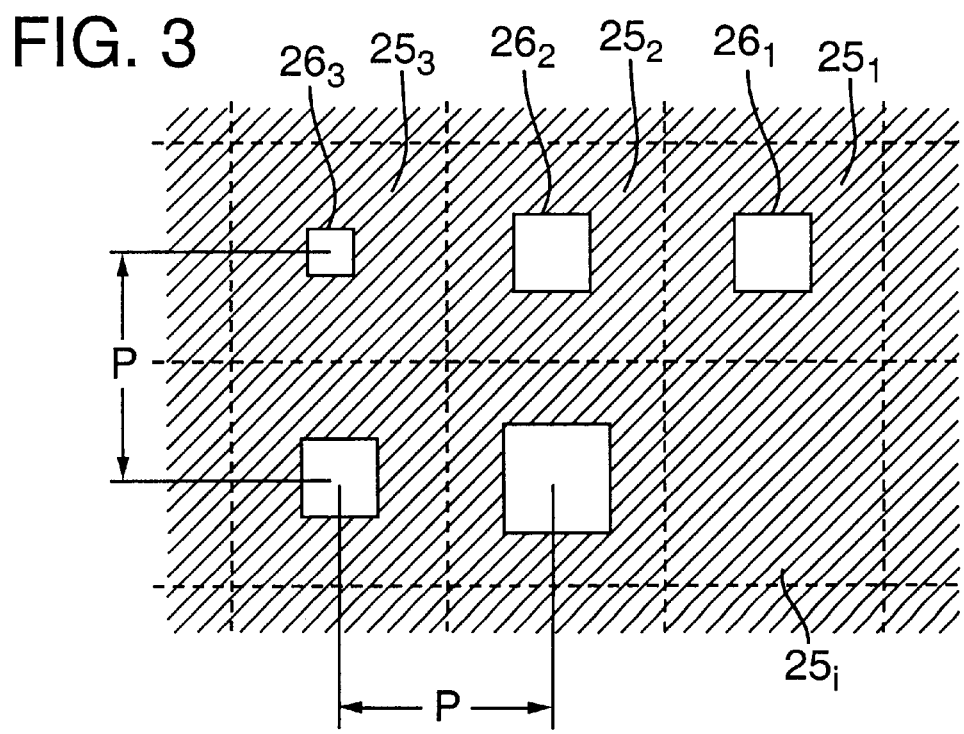
FIG. 3 is an enlarged schematic plan view of a portion of the compensation mask FIG. 2, showing subfields and apertures.

A representative compensation mask 6 is shown in FIG. 2, showing a region 22A corresponding to a region on the wafer 7 that receives the pattern-transfer exposure (i.e., the region filled by multiple dies placed side by side on the wafer). The normal extent of "back-scatter" on the wafer 7 is indicated by the circle 23 having a diameter ϕ, which is used to define a back-scatter border 22B of width W around the pattern-transfer exposure region 22A. The width W is not less than ϕ/2. For example, the width W may be about 40 μm. The region 24 on the compensation mask 6 encompassed by the regions 22A, 22B is divided vertically and horizontally into subfields $25_1, 25_2, 25_3, \ldots$, having a pitch P. Each such subfield is smaller than ϕ/2. For example, when the diameter ϕ is approximately 40 μm, the pitch P may be set at 3 μm. As shown in FIG. 3, certain of the subfields (e.g., $25_1, 25_2, 25_3$) have corresponding apertures $26_1, 26_2, 26_3$, that allow passage therethrough of the particle beam. Thus, multiple apertures are provided within the region 24 on the compensation mask 6 in the X dimension and in the Y dimension. It will be noted, however, that certain other subfields (e.g., subfield $25_i$ in FIG. 3) on the compensation mask 6 lack apertures.

Figure 5:
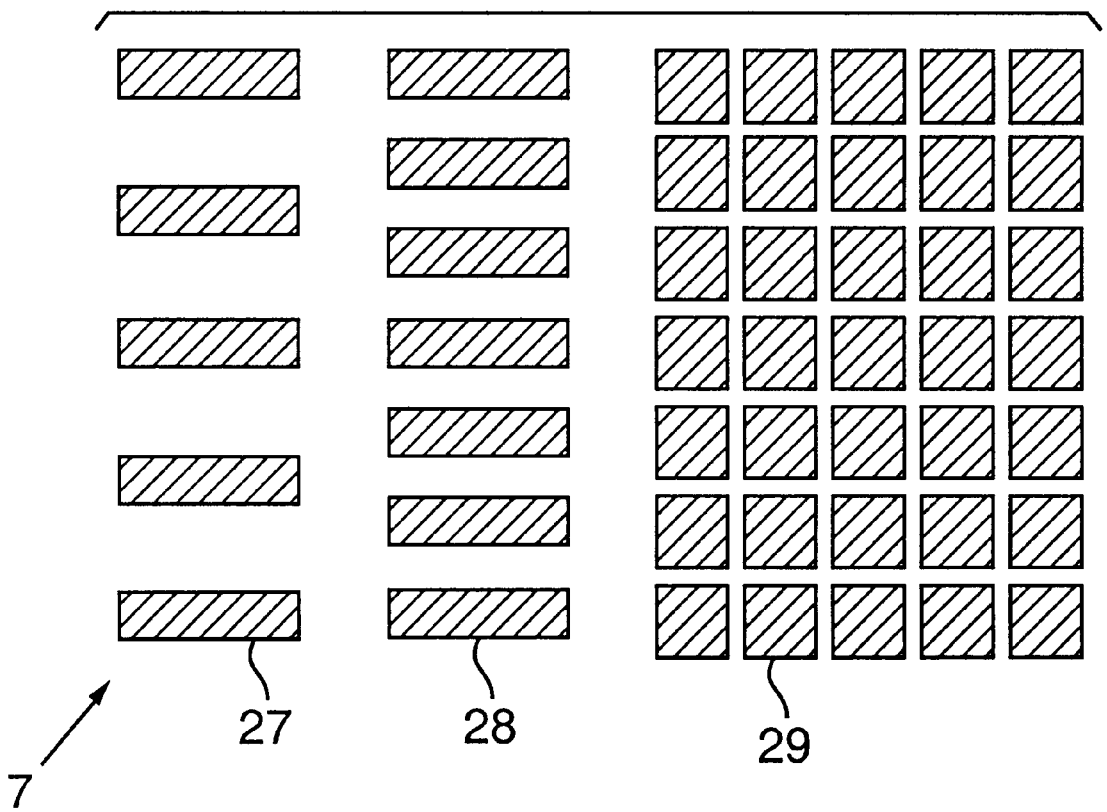
FIG. 5 is an enlarged schematic plan view showing exemplary pattern features transferred onto the wafer.

The sizes of the apertures, and whether or not an aperture is present in a subfield, are determined as discussed below with references to FIGS. 5–7. A portion of an exemplary pattern transferred to the surface of the wafer 7 is shown in FIG. 5. Features 27, 28, and 29, indicated by hatching, are defined on a reticle and transferred by projection-exposure using a particle beam to the surface of the wafer, preferably without irradiating intervening regions between the features. However, due to back-scatter, regions outside (e.g., between) the features 27, 28, 29 also receive radiation during the pattern-transfer exposure. The magnitude of this "back-scatter" irradiation tends to be relatively large at the periphery of features that receive a large amount of pattern-transfer irradiation; i.e., in regions of the pattern where the feature density is high. For example, in FIG. 5, more back-scatter will occur at the periphery of each of the more densely arranged features 28 than at the periphery of each of the more dispersed features 27. Similarly, more back-scatter will occur at the periphery of each of the features 29 than at the periphery of each of the features 28. As can be seen, the more densely the features are situated relative to each other, the narrower the linewidths between the features. To compensate for differing degrees of proximity effects arising with such differing "packing densities" of features, the magnitude of the compensation exposure is made relatively large in subfields comprising the features 27, and relatively small in subfields comprising the features 29.

Figure 6:
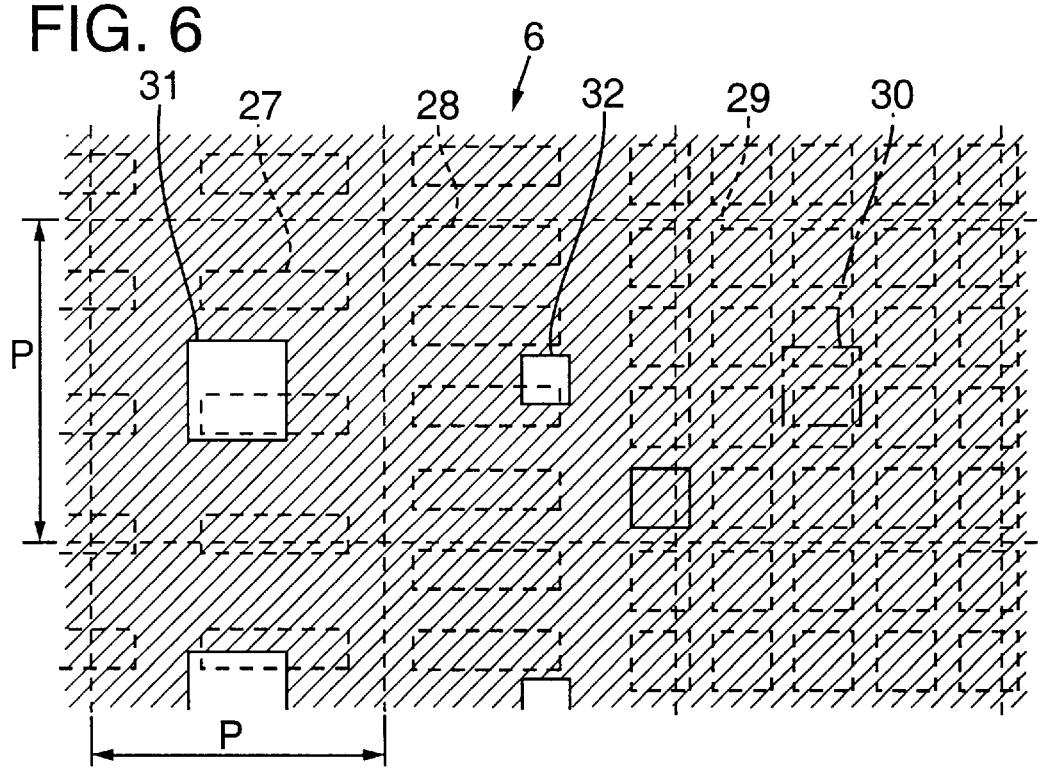
FIG. 6 is an enlarged schematic plan view showing a portion of a compensation mask, with subfields and apertures overlying the pattern of FIG. 5.
Figure 7:
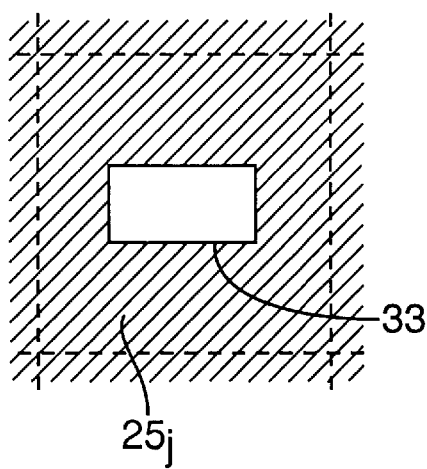
FIG. 7 is an enlarged schematic plan view showing an aperture formed at a subfield on the periphery of the compensation mask.

FIG. 6 shows an example of how each aperture (if present) in a respective subfield on the compensation mask 6 is sized relative to the packing density of pattern features in each subfield. The features 27, 28, 29 are as shown in FIG. 5, and the hatched area represents the compensation mask 6 overlying and in register with the subfields. The subfields have a pitch P (e.g., 3 μm). As can be seen, certain subfields have a corresponding aperture (non-hatched; e.g., apertures 31, 32) and others do not. Each of the apertures shown also preferably has a shape corresponding to the shape of the corresponding subfield (e.g. square as shown). The aperture 31 is relatively large and is situated in a subfield on the compensation mask 6 corresponding to a region in which the feature density is relatively low (a subfield comprising the features 27). The aperture 32, on the other hand, is relatively small and is situated in a subfield corresponding to a region in which the feature density is moderate (a subfield comprising mostly the features 28). No aperture is situated in subfields corresponding to regions in which the feature density is high (subfields comprising the features 29).

Further with respect to FIG. 6, a reference square 30 is situated in a subfield containing the most densely packed features 29 of the pattern. The area of the reference square 30 corresponds to the total area of the nominally unexposed regions in that subfield (i.e., the total area, within the subfield, not occupied by actual features). In determining the size of apertures (if any) in other subfields, the area of the reference square 30 is subtracted from the sum, for each subfield, of the areas of nominally unexposed regions. If the area of the reference square 30 is equal to the area of nominally unexposed regions in a subfield, then that subfield is not provided with a corresponding aperture on the compensation mask. If the area of the reference square 30 is less than the area of nominally unexposed regions in a subfield, then that subfield is provided with an aperture having an area equal to the difference in the areas.

Although, in FIG. 6, the apertures 31, 32 are shown in the center of the corresponding subfields, each aperture is preferably centered at a location within the corresponding subfield representing the center of mass of the respective nominally unexposed regions in the subfield.

Turning again to FIG. 2, compensation exposure is great at subfields overlying the back-scatter border 22B. In such subfields (e.g., subfield $25_j$ in FIG. 7), if an aperture is indicated, the aperture 33 (FIG. 7) preferably has a rectangular shape to facilitate escape to the periphery of heat generated by the particle-beam radiation. In the compensation mask 6, the alignment marks 11A, 11B are preferably situated within such subfields.

The apertures on the compensation mask 6 are preferably formed using an electron-beam. With respect to an 8-inch wafer, the number of 3 μm×3 μm subfields is determined to be approximately 36.3×10⁸, as follows:

$$\pi \cdot [102/(3 \times 10^{-3})]^2 = 36.3 \times 10^8$$

Each aperture at each subfield on the compensation mask 6 receiving an aperture is formed by a single pulse of the electron beam.

Referring now to FIG. 1, with the compensation mask 6 mounted on the compensation-mask stage 9, the wafer stage 8 is moved via the stage drive 10. Alignment of the compensation mask 6 with the wafer 7 is preferably performed using a registration-measurement device or analogous device situated outside the housing for the electronic lenses and deflectors. Preferably, for example, alignment in the X and Y dimensions of the alignment mark 11A with the alignment mark 12A is measured using a dark-field-illumination optical microscope 14A. The optical lens 13A, attached to movable stage 8, is used to facilitate such measurement. Another dark-field-illumination optical microscope 14B is provided to measure alignment of the marks 11B and 12B (as facilitated by the optical lens 13B).

FIG. 4 shows a representative image, as obtained using a dark-field-illumination optical microscope, of the alignment marks 11A, 12A aligned with each other. The image 12AM of the alignment mark 12A, produced via the optical lens 13A, is situated within the alignment mark 11A. Whenever both marks 11A, 11B are aligned with their corresponding marks 12A, 12B, respectively, in the manner shown in FIG. 4, the compensation mask 6 is properly aligned with the wafer. Any required adjustment of the compensation mask 6 to achieve such alignment is made by corresponding motions of the compensation-mask stage 9 in the X dimension, Y dimension, and rotationally about the axis AX. As a result, for example, the subfields $25_1, 25_2, 25_3, \ldots$, on the compensation mask 6 (FIG. 2) are respectively positioned over the corresponding subfields on the wafer 7.

The shape of each irradiation region 15 is determined, at least in part, by the shape of each die on the wafer. In FIG. 2, the main exposure region 22A represents a region on the wafer 7 in which multiple dies (each die containing an entire "chip" circuit pattern) will be exposed side by side. By way of example, suppose that the shape of each die is a rectangle of 30 mm in the X dimension and 20 mm in the Y dimension. Each radiation region 15 of the compensation mask 6 would have a dimension LX of 10 mm and a dimension LY of 20.5 mm. (The compensation mask is illuminated or irradiated by scanning or sweeping the beam along the X dimension, and the cross-sectional area of the beam along the X dimension is about 10 mm in the X dimension and about 20 mm in the Y dimension.) The dimension LY is set to be roughly equal to the Y-dimension (the dimension in which the shorter of the rectangular sides of the die extends) of each die on the wafer 7. During compensation exposure, while advancing the radiation region 15 at a pitch of 20 mm in the Y dimension, the respective radiation regions 15 are swept at a constant velocity in the X dimension on the compensation mask 6. As a result, the entire surface of the compensation mask 6 is sequentially swept by the electron beam. The sweep velocity is set to achieve desired compensating exposure values. By following this procedure, back-scattering is made substantially uniform over the entire surface of the wafer 7, and favorable compensation of the proximity effect is achieved.

In the above example, compensation exposure is overlapped approximately 0.25 mm in the Y dimension at the boundary regions between adjacent dies on the wafer 7. However, because there is no circuit pattern at the boundary regions between dies, this is not a problem. In any event, any unevenness in compensation exposure is eliminated over the regions on the wafer 7 actually occupied by dies. The LY dimension of the radiation region 15 may also be an integral multiple (e.g., 2×) the Y dimension of the die pattern. This enables the boundary regions of the die to be made to match boundary regions that would exist if compensation exposure were performed using a swept electron beam. Thus, when compensation exposure is performed using a swept electron beam, compensation of the proximity effect can be advantageously and accurately performed at the interior of each of the die patterns, even if the areas swept by the electron-beam cannot be precisely aligned with each other. Further, because the sweep velocity of the electron beam is preferably constant, there is no unevenness in compensation exposure in the sweep direction.

As described above with respect to the multiple subfields on the compensation mask 6, any aperture that is formed is small to the extent that the respective subfield corresponds to a subfield on the wafer 7 having nominally unexposed regions that are small in area. There will be no apertures formed in certain subfields containing the most densely packed features and/or narrowest linewidths. Because compensation exposure is not performed in such high-density subfields, even if a negative resist is used, linewidths of nominally unexposed regions do not narrow or exceed tolerance by the so-called scumming phenomenon.

Further with respect to FIG. 1, since alignment of the alignment marks 11A, 11B on the compensation mask 6 with the marks 12A and 12B on the wafer 7 is performed using the optical lenses 13A, 13B, respectively, attached to the movable wafer stage 8, the apertures on the compensation mask 6 are accurately aligned with the corresponding subfields on the wafer 7. This permits accurate compensation exposure of the wafer 7.

A compensation-exposure apparatus having a simpler construction than either a projection-transfer apparatus or a scanning apparatus can be used to perform compensation exposure on the wafer 7. The preferred apparatus performs the compensating exposure of at least an entire die per pulse of the electron beam. This provides a marked improvement in throughput compared to apparatus that must iteratively transfer the compensation pattern subfield by subfield.

Since practically no compensation exposure is performed at regions on the wafer at which features are formed at high density, any further narrowing of narrow linewidths of nominally unexposed patterns caused by the scumming phenomenon in cases where negative-type particle-beam-sensitive materials are used is eliminated. This allows accurate compensation of the proximity effect even when negative-type particle-beam-sensitive material is used.

While negative resist is discussed above in connection with the preferred example embodiment, a positive resist can alternatively be used. Where a positive resist is used, compensation exposure according to the invention provides satisfactory reduction of proximity effects. Especially because a decrease in the scumming phenomenon at high-density regions is possible according to the invention, circuit patterns can now be transferred with high resolution.

Although an electron beam was used to perform compensation exposure in the preferred example embodiment, it will be understood that the general principles disclosed above are also applicable to methods and apparatus employing other energy beams, such as ion beams, ultraviolet rays, etc.

While the invention has been described in connection with example embodiments, it will be understood that the invention is not limited to those embodiments. On the contrary, the invention is intended to cover all alternatives, modifications, and equivalents as may be included within the spirit and scope of the invention as defined by the appended claims.

What is claimed is:

1. An apparatus for compensating backscatter on a substrate coated with a particle-beam-sensitive resist, the apparatus comprising on an optical axis:

(a) a source operable to produce an energy beam to which the resist is sensitive;

(b) a substrate stage operable to hold the substrate; and (c) a compensation mask comprising multiple subfields corresponding to subfields on the substrate, at least some of which subfields on the compensation mask defining a respective aperture such that the energy beam must pass through an aperture to reach a corresponding subfield on the resist, each subfield on the compensation mask being smaller in width than the spread-width of energy backscatter in the substrate, each of the apertures having a transverse profile defining an area corresponding, for the respective subfield on the resist, to an area of nominally unexposed regions less a constant.

2. The apparatus of claim 1, further comprising, on the optical axis, an objective lens operable to focus the energy beam on the compensation mask.

3. The apparatus of claim 2, wherein the energy beam is an electron beam.

4. The apparatus of claim 3, further comprising a deflector operable to deflect the electron beam from the optical axis to an irradiation region on the compensation mask.

5. The apparatus of claim 1, wherein the compensation mask further comprises plural alignment marks corresponding to alignment marks on the substrate.

6. The apparatus of claim 5, further comprising a substrate stage operable to hold the substrate, the substrate stage comprising a compensation-mask stage operable to hold the compensation mask a predetermined distance from the substrate.

7. The apparatus of claim 6, further comprising an optical lens operable to conjugate the alignment marks on the compensation mask with the alignment marks on the substrate.

8. The apparatus of claim 7, wherein the optical lens is mounted to the substrate stage.

9. The apparatus of claim 8, further comprising an optical microscope operable to detect the alignment of the alignment marks on the compensation mask with the corresponding alignment marks on the substrate.

10. The apparatus of claim 1, wherein the subfields are defined in a back-scatter border of width W around the pattern-transfer exposure region, wherein the width W is equal to or greater than the radius of the spread-width of energy backscatter in the substrate.

* * * * *

UNITED STATES PATENT AND TRADEMARK OFFICE
CERTIFICATE OF CORRECTION

PATENT NO. : 5,986,765
DATED : November 16, 1995
INVENTOR(S) : Mamoru Nakasuji

Page 1 of 1

It is certified that error appears in the above-identified patent and that said Letters Patent is hereby corrected as shown below:

<u>Column 6,</u>
Line 27, "diameter 0" should be --diameter $\phi$--.

Signed and Sealed this

Twelfth Day of June, 2001

*Attest:*

*Attesting Officer*

NICHOLAS P. GODICI
*Acting Director of the United States Patent and Trademark Office*